(12) United States Patent
Otremba et al.

(10) Patent No.: US 9,525,063 B2
(45) Date of Patent: Dec. 20, 2016

(54) SWITCHING CIRCUIT

(71) Applicant: Infineon Technologies Austria AG, Villach (AT)

(72) Inventors: Ralf Otremba, Kaufbeuren (DE); Klaus Schiess, Allensbach (DE); Rainald Sander, Munich (DE)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 14/067,462

(22) Filed: Oct. 30, 2013

(65) Prior Publication Data

US 2015/0115324 A1 Apr. 30, 2015

(51) Int. Cl.
| | | |
|---|---|---|
| *H01L 29/66* | (2006.01) | |
| *H01L 29/78* | (2006.01) | |
| *H01L 29/20* | (2006.01) | |
| *H01L 29/778* | (2006.01) | |
| *H01L 23/00* | (2006.01) | |
| *H01L 21/8258* | (2006.01) | |

(Continued)

(52) U.S. Cl.
CPC ....... *H01L 29/7827* (2013.01); *H01L 21/8258* (2013.01); *H01L 24/34* (2013.01); *H01L 24/73* (2013.01); *H01L 27/0688* (2013.01); *H01L 27/0883* (2013.01); *H01L 29/2003* (2013.01); *H01L 29/7787* (2013.01); *H01L 2224/48091* (2013.01); *H01L 2224/48137* (2013.01); *H01L 2224/49109* (2013.01); *H01L 2224/73257* (2013.01); *H01L 2924/12036* (2013.01); *H01L 2924/13055* (2013.01); *H01L 2924/13091* (2013.01); *H01L 2924/181* (2013.01)

(58) Field of Classification Search
CPC ............. H01L 29/2003; H01L 29/7787; H01L 29/7827; H01L 21/8258; H01L 27/0883; H01L 27/0688; H01L 2924/00; H01L 2924/12036; H01L 2924/181; H01L 2924/13091; H01L 2924/13055; H01L 2924/00014; H01L 2924/00012
USPC .................................................. 257/194, 328
See application file for complete search history.

(56) References Cited

U.S. PATENT DOCUMENTS

| | | |
|---|---|---|
| 4,093,875 A | 6/1978 | Knepper |
| 4,908,682 A | 3/1990 | Takahashi |

(Continued)

FOREIGN PATENT DOCUMENTS

| | | |
|---|---|---|
| DE | 19610135 C1 | 6/1997 |
| DE | 102004041886 B4 | 3/2006 |

(Continued)

OTHER PUBLICATIONS

Unknown, Author. "Power MOSFET Basics" Application Notes MOS-007. Date unknown. pp. 1-10. Alpha & Omega Semiconductor. Accessed at: <http://www.aosmd.com/applications/notes/mosfets>.

(Continued)

*Primary Examiner* — Vongsavanh Sengdara
(74) *Attorney, Agent, or Firm* — Murphy, Bilak & Homiller, PLLC

(57) ABSTRACT

In an embodiment, a switching circuit includes input drain, source and gate nodes, a high voltage depletion mode transistor including a current path coupled in series with a current path of a low voltage enhancement mode transistor, and an overheating detection circuit for detecting overheating of the switching circuit.

20 Claims, 4 Drawing Sheets

(51) Int. Cl.
*H01L 27/06* (2006.01)
*H01L 27/088* (2006.01)

(56) References Cited

U.S. PATENT DOCUMENTS

| | | | |
|---|---|---|---|
| 5,025,298 | A | 6/1991 | Fay et al. |
| 5,034,796 | A | 7/1991 | Zommer |
| 5,079,608 | A | 1/1992 | Wodarczyk et al. |
| 5,153,696 | A | 10/1992 | Kayama |
| 5,422,593 | A | 6/1995 | Fujihira |
| 5,726,481 | A | 3/1998 | Moody |
| 6,084,462 | A | 7/2000 | Barker |
| 6,791,810 | B2 | 9/2004 | Nakamura et al. |
| 7,038,525 | B2 | 5/2006 | Kato |
| 7,122,882 | B2 | 10/2006 | Lui et al. |
| 7,288,803 | B2 | 10/2007 | Beach et al. |
| 7,501,670 | B2 | 3/2009 | Murphy |
| 7,719,055 | B1 * | 5/2010 | McNutt ............... H01L 29/0843 257/280 |
| 7,777,553 | B2 | 8/2010 | Friedrichs |
| 7,782,099 | B2 | 8/2010 | Kawamura |
| 7,915,645 | B2 | 3/2011 | Briere |
| 8,017,978 | B2 | 9/2011 | Lidow et al. |
| 8,368,120 | B2 | 2/2013 | Lidow et al. |
| 2004/0130037 | A1 | 7/2004 | Mishra et al. |
| 2006/0002154 | A1 | 1/2006 | Amrani et al. |
| 2006/0018172 | A1 | 1/2006 | Kuroda et al. |
| 2006/0193173 | A1 | 8/2006 | Iwahashi |
| 2007/0171692 | A1 | 7/2007 | Kuroda et al. |
| 2009/0321787 | A1 | 12/2009 | Murphy et al. |
| 2011/0309372 | A1 | 12/2011 | Xin et al. |
| 2011/0316045 | A1 | 12/2011 | Liu et al. |
| 2012/0262220 | A1 | 10/2012 | Springett |
| 2012/0271991 | A1 | 10/2012 | Allen et al. |
| 2012/0275253 | A1 | 11/2012 | Ferrant et al. |
| 2012/0292635 | A1 | 11/2012 | Iketani et al. |
| 2014/0159119 | A1 | 6/2014 | Derluyn et al. |
| 2014/0210519 | A1 | 7/2014 | Ribarich |
| 2014/0225163 | A1 | 8/2014 | Briere |
| 2014/0227983 | A1 | 8/2014 | Clausen et al. |
| 2014/0253218 | A1 | 9/2014 | Dix et al. |
| 2014/0264454 | A1 | 9/2014 | Banerjee et al. |
| 2014/0375242 | A1 | 12/2014 | Briere |
| 2015/0035568 | A1 * | 2/2015 | Peng ..................... H01L 27/088 327/109 |
| 2015/0035586 | A1 * | 2/2015 | Weis ..................... H03K 17/687 327/436 |

FOREIGN PATENT DOCUMENTS

| | | |
|---|---|---|
| DE | 102005034012 A1 | 11/2006 |
| EP | 0224274 A2 | 6/1987 |
| EP | 0409214 A2 | 1/1991 |
| EP | 0414499 A2 | 2/1991 |
| EP | 0488088 A1 | 6/1992 |
| EP | 0409214 B1 | 12/1995 |

OTHER PUBLICATIONS

Clemente, S., et al.—"An Introduction to the HEXSense Current-Sensing Device." 1986, pp. 1-6, AN-959, International Rectifier, El Segundo, California, USA.

Unknown, Author, "Current Protection and Measurement." Application Note 2015, May 1, 2009, pp. 1-13, Zilker Labs, Austin, USA.

Unknown, Author, "A Simple Current-Sense Technique Eliminating a Sense Resistor." Application Note 7, Jul. 1998, pp. 1-6, Rev 1.1, LinFinity Microelectronics.

Munson, J., et al. "Current Sense Circuit Collection." Application Note 105, Dec. 2005, pp. 1-76, Linear Technology.

Unknown, Author, "Current Sensing Power MOSFETS," Application Note 10322, Jun. 24, 2009, pp. 1-10, Rev. 2.24, NXP Semiconductors.

Pandya, K., "Current-Sensing Power MOSFETs," Application Note 606, Dec. 17, 2003, pp. 1-4, Document No. 71991, Vishay Siliconix.

Pandya, K., "Temperature Sensing Power MOSFET," Application Note 820, Jul. 13, 2001, pp. 1-6, Document No. 71621, Vishay Siliconix.

Starks, A., "Using SENSEFET with CAT2300 in Load Switch Applications," Application Note 9039/d, Aug. 2011, pp. 1-5, ON Semiconductor.

Zaremba, D., "Low-Side Self-Protected MOSFET." Application Note 8202/D, Feb. 2011, pp. 1-13, Rev. 1, ON Semiconductor.

* cited by examiner

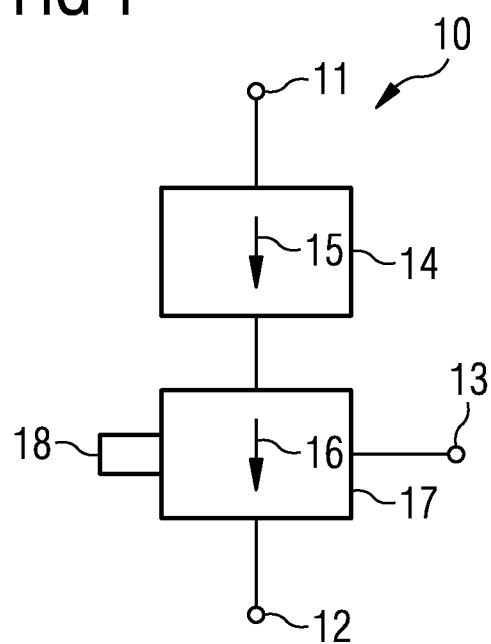

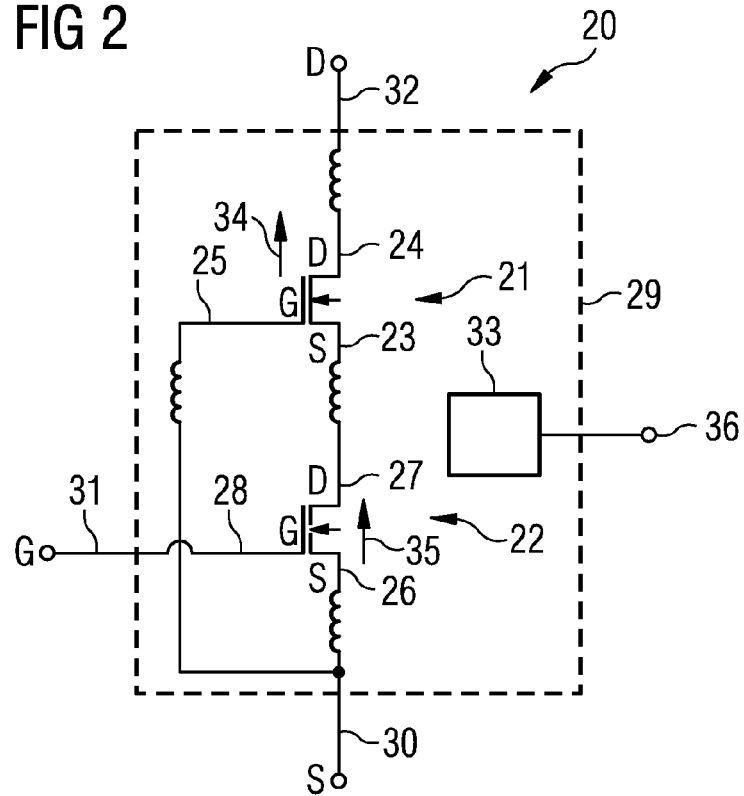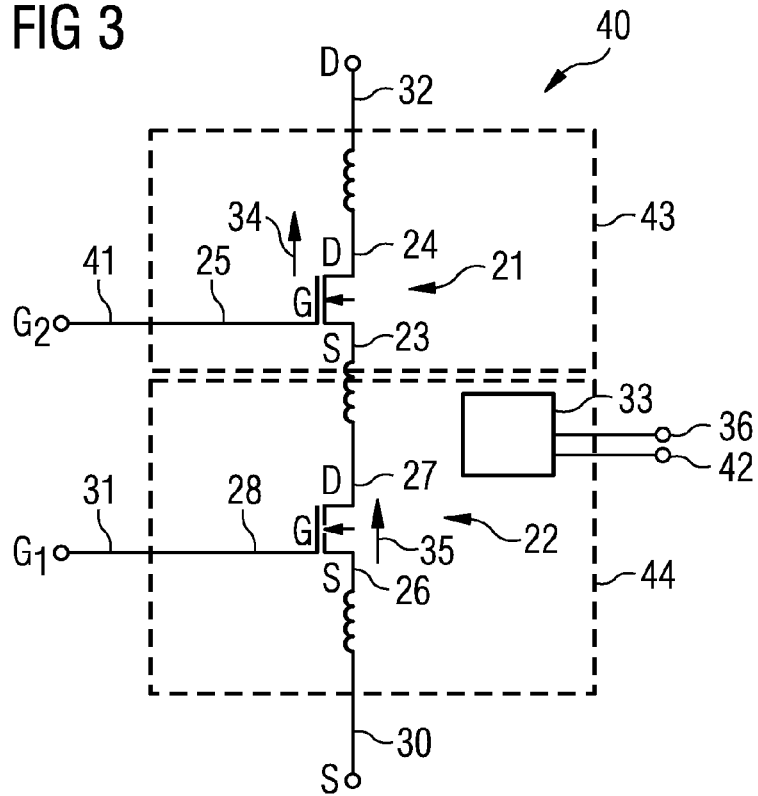

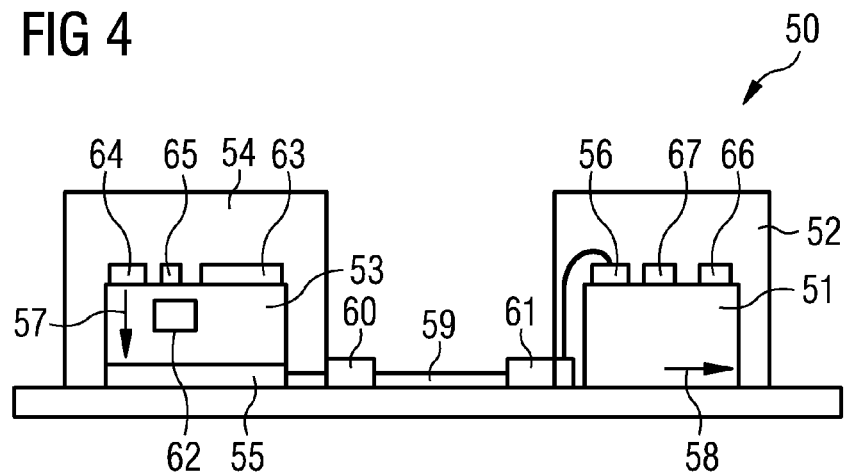
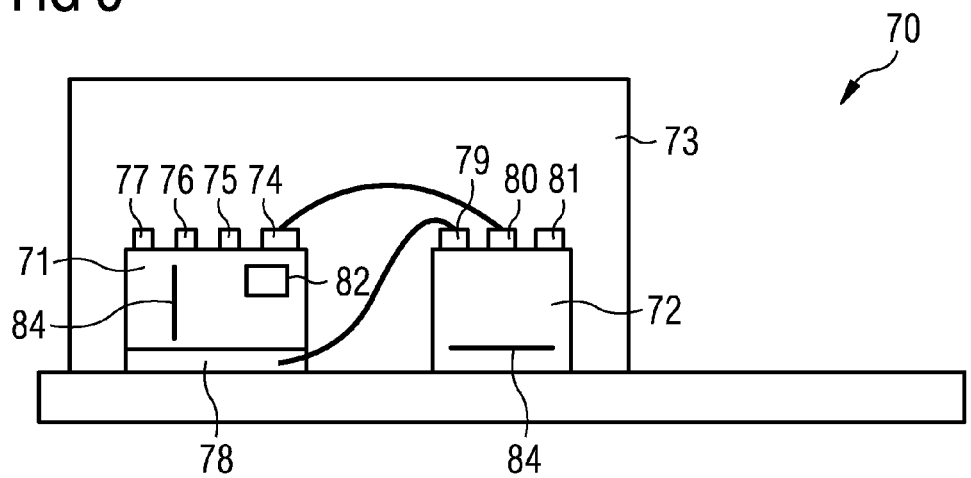
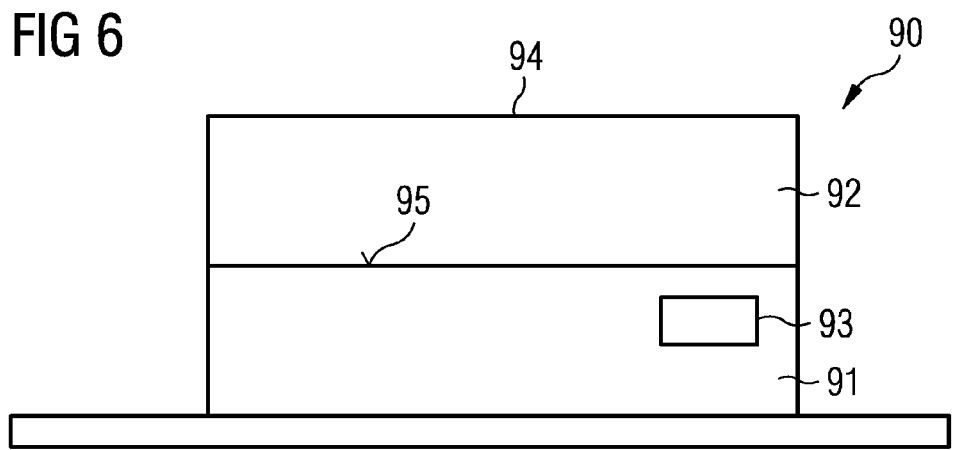

SWITCHING CIRCUIT

BACKGROUND

To date, transistors used in power electronic applications have typically been fabricated with silicon (Si) semiconductor materials. Common transistor devices for power applications include Si CoolMOS, Si Power MOSFETs, and Si Insulated Gate Bipolar Transistors (IGBTs). Compound semiconductors, for example III-V compound semiconductors such as GaAs are also useful in some applications. More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times.

SUMMARY

In an embodiment, a switching circuit includes input drain, source and gate nodes, a high voltage depletion mode transistor including a current path coupled in series with a current path of a low voltage enhancement mode transistor, and an overheating detection circuit for detecting overheating of the switching circuit.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1 illustrates a switching circuit according to an embodiment.

FIG. 2 illustrates a schematic diagram of a switching circuit including a cascode arrangement.

FIG. 3 illustrates a schematic diagram of a switching circuit.

FIG. 4 illustrates a switching circuit including two packages according to an embodiment.

FIG. 5 illustrates a switching circuit including a single composite package according to an embodiment.

FIG. 6 illustrates a monolithically integrated switching circuit according to an embodiment.

DETAILED DESCRIPTION

Figure 7:
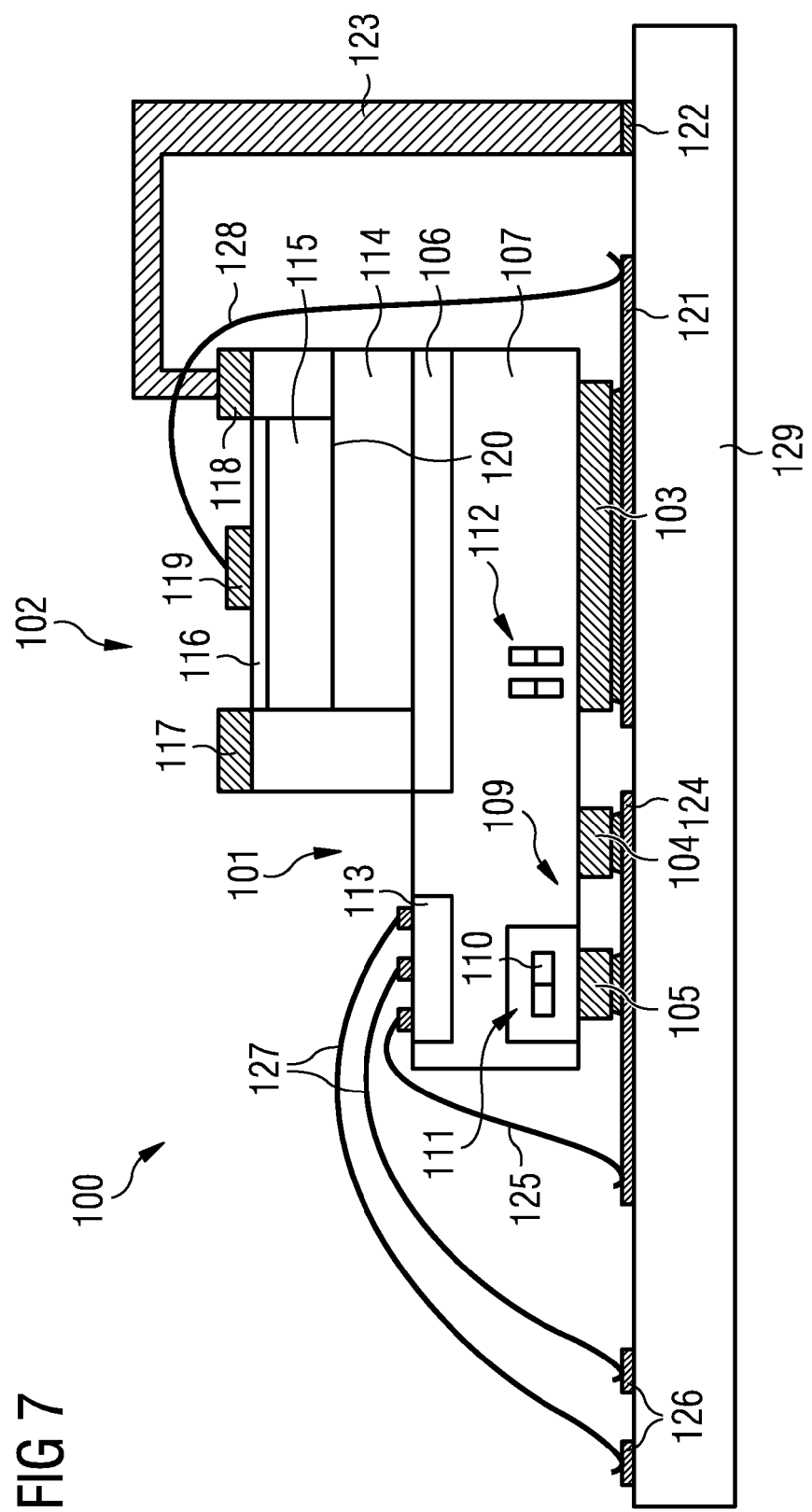
FIG. 7 illustrates a monolithically integrated switching circuit according to an embodiment.

In the following detailed description, reference is made to the accompanying drawings, which form a part hereof, an in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

As employed in this specification, the terms "coupled" and/or "electrically coupled" are not meant to mean that the elements must be directly coupled together-intervening elements may be provided between the "coupled" or "electrically coupled" elements.

A depletion-mode device, such as a high-voltage depletion-mode transistor, has a negative threshold voltage which means that it can conduct current at zero gate voltage. These devices are normally on. And enhancement-mode device, such as a low-voltage enhancement-mode transistor, has a positive threshold voltage which means that it cannot conduct current at zero gate voltage and is normally off.

As used herein, a "high-voltage device", such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the switching circuit for which it is used. A high-voltage device may be capable of blocking 300 V, 600 V, 1200 V, or other suitable blocking voltage required by the application.

As used herein, a "low-voltage device", such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

As used herein, a compound semiconductor device may include any suitable semiconductor material that forms a field-effect transistor (FET) such as an insulated-gate FET (IGFET), or a high electron mobility transistor (HEMT), for example. Suitable semiconductor materials include compound semiconductor materials such as SiGe, SiC and group III-V materials including group III-Arsenide, group III-Phosphide, group III-Nitride or any of their alloys. Therefore, the phrase "group III-V" refers to a compound semiconductor that includes a group V element and at least one group III element. Moreover, th phrase "group III-Nitride" refers to a compound semiconductor that includes nitrogen (N) and at least one group III element. Including aluminum (Al), gallium (Ga), indium (In), and boron (B), and including but not limited to any of its alloys, such as aluminum. gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aP_bN_{(1-a-b)}$), for example. Group III-Nitride also refers generally to any polarity including but not limited to Ga-polar, N-polar, semi-polar or non-polar crystal orientations.

Aluminum gallium. nitride refers to an alloy described by the formula $Al_xGa_{(1-x)}N$, where x>1.

These semiconductor materials are semiconductor compounds that have a relatively wide, direct bandgap, and have high critical breakdown fields, high saturation drift velocity and good thermal conductivity. As a result, III-Nitride materials such as GaN are used in many microelectronic applications in which high power density and high efficiency switching are required.

FIG. 1 illustrates a switching circuit 10 according to an embodiment. The switching circuit 10 includes an input drain node 11, an input source node 12, an input gate node 13, a high-voltage depletion mode transistor 14 including a current path 15 coupled in series with a current path 16 of a low voltage enhancement mode transistor 17. The switching circuit further includes an overheating detection circuit 18 for detecting overheating of the switching circuit 10.

A switching circuit 10 is provided that includes a temperature sense function and overheating protection. The overheating detection circuit 18 may be provided as a separate component and placed such that it is thermally coupled with the switching circuit 10 or the overheating detection circuit 19 may be at least partially integrated in the low voltage enhancement mode transistor 17 and, therefore, thermally coupled with the switching circuit 10. The high voltage depletion mode transistor 14 is thermally coupled with the low voltage enhancement mode transistor 17 so that the overheating detection circuit can detect overheating of the high voltage depletion mode transistor 14 and/or of the low voltage enhancement mode transistor 17.

The low voltage enhancement mode transistor 17 may be an IGFET (Insulated Gate Field Effect Transistor), for example a p-channel MOSFET.

The high-voltage depletion mode transistor 14 may be a Group III nitride-based transistor or a Group III nitride-based high electron mobility transistor (HEMT).

The overheating detection circuit 18 may include a biased pn junction having a predetermined temperature dependent voltage characteristic. The pn junction may be forward biased or reverse biased.

In an embodiment, the biased pn junction is integrated in a semiconductor substrate and, in particular, in the same semiconductor substrate as the low voltage enhancement mode transistor 17. The low voltage enhancement mode transistor 17 may include a plurality of transistor cells connected in parallel with each other and integrated in the semiconductor substrate. The biased pn junction may be integrated in the same semiconductor substrate.

In an embodiment, the low voltage enhancement mode transistor 17 comprises a plurality of transistor cells connected in parallel with each other and integrated in a semiconductor substrate and a forward biased pn junction integrated in the same semiconductor substrate. The forward biased pn junction has a voltage drop which is inversely proportional to the junction temperature.

The switching circuit 10 may further comprise voltage means coupled to the forward biased pn junction for producing a voltage proportional to the voltage drop.

The overheating detection circuit 18 may include threshold means for receiving the voltage and producing a signal when the voltage exceeds a threshold voltage to indicate that the low voltage enhancement mode transistor 17 is overheated.

In an embodiment, the low voltage enhancement mode transistor 17 includes a plurality of transistor cells connected in parallel with each other and integrated in a semiconductor substrate and a reverse biased pn junction integrated in the same semiconductor substrate. The reverse biased pn junction has a leakage current flow which is temperature dependent. The switching circuit 10 may further include voltage means coupled to the reverse biased pn junction for producing a voltage proportional to the reverse leakage current flow. The overheating detection circuit 18 may include threshold means for receiving voltage and for producing a signal when the voltage exceeds a threshold voltage to indicate that the low voltage enhancement mode transistor 17 is overheated.

The overheating detection circuit 18 may further include a first overheating detection pad and, optionally, a second overheating detection pad which are positioned on the semiconductor substrate and coupled to the biased pn junction.

The switching circuit 10 may further include at least one overheating detection node.

The high-voltage mode depletion transistor 14 may be operatively connected in a cascode arrangement to the low voltage enhancement mode transistor 17.

In an embodiment, the high-voltage depletion mode transistor 14 is directly driven.

The high-voltage depletion mode transistor 14 and the low voltage enhancement mode transistor 17 may have different arrangements.

In an embodiment, the high-voltage depletion mode transistor 14 may be provided as a discrete component and the low voltage enhancement mode transistor 17 may be provided as a discrete component.

In an embodiment, the high-voltage depletion mode transistor and the low voltage enhancement mode transistor are mounted adjacent one another in a composite package.

In an embodiment, the high-voltage depletion mode transistor 14 and the low voltage enhancement mode transistor 17 are monolithically integrated.

The high voltage depletion mode transistor 14 of the switching circuit 10 is, in operation, normally on. In embodiments in which it is desirable that the high voltage depletion mode transistor 14 is normally off, this may be achieved by operatively connecting the high voltage depletion mode transistor 14 in a cascode arrangement to the low voltage enhancement mode transistor 17.

FIG. 2 illustrates a schematic diagram of a switching circuit 30 including such a cascode arrangement.

In the switching circuit 20, a high voltage depletion-mode transistor 21, which is normally on, is combined with a low voltage enhancement-mode transistor 22, which is normally off, to form a hybrid device which is normally off.

The high voltage depletion-mode transistor 21 includes a source 23, a drain 24 and a gate 25. The low voltage enhancement-mode transistor 22 also includes a source 26, a drain 27 and a gate 28.

The source 23 of the high voltage depletion mode transistor 21 is electrically coupled to the drain 27 of the low voltage enhancement-mode transistor 22. The gate 25 of the high voltage depletion-mode transistor 21 is electrically coupled with the source 26 of the low voltage enhancement-mode transistor 22 in a cascode configuration.

The high voltage depletion mode transistor 21 and the low voltage enhancement-mode transistor 22 may be provided in a single package or in a composite semiconductor body, illustrated schematically in FIG. 2 with a dotted line 29.

The switching circuit includes an input source node 30, an input gate node 31 and an input drain node 32. The source node 30 may be denoted as a low voltage lead and the drain node 32 may be denoted as a high voltage lead. In the example illustrated in FIG. 2, 0 V may be applied to the low voltage lead 40 and 600 V to the high voltage lead 32.

The source 26 of the low voltage enhancement-mode transistor 22 and the gate 25 of the high voltage depletion-mode transistor 21 are both electrically coupled to the source node 30. The gate 28 of the low voltage enhancement-mode transistor 22 is electrically coupled to the gate node 31 and may be driven by a gate driver circuit coupled to the gate node 31. The drain 24 of the high voltage depletion-mode transistor 22 is electrically coupled to the drain node 22.

The switching circuit 20 further includes an overheating detection circuit 33 for detecting overheating of the switching circuit 20. The overheating detection circuit 33 may be thermally coupled to the switching circuit, for example, by being thermal contact with the low voltage enhancement mode transistor 22. The overheating detection circuit may be at least partially integrated in the low voltage enhancement mode transistor 22.

The overheating detection circuit 33 is coupled to a sense node 36 of the switching circuit 20.

FIG. 3 illustrates a schematic diagram of a switching circuit 40 in which the gate 25 of the high voltage depletion-mode transistor 21 is directly driven, rather than being electrically coupled with the source 25 of the low voltage enhancement-mode transistor 22 in a cascode configuration in order to provide a hybrid normally off switching circuit 40.

The switching circuit 40 further includes a second gate node 41 that is electrically coupled to the gate 25 of the high voltage depletion-mode transistor 21. The gate 25 is directly controlled by use of the second gate node 41. The switching circuit 40 further includes a second sense node 42 which is coupled to the sense circuit 33.

The switching circuit 40 may be provided by two discrete components indicated with the dotted lines 43 and 44 in FIG. 3. The components 43, 44 may be provided by separate semiconductor packages or by separate semiconductor transistor devices mounted in a common package to provide a composite package. In the switching circuit 40 illustrated in FIG. 3, the overheating detection circuit 33 is associated with the low voltage enhancement mode transistor 22 and may be monolithically integrated in the low voltage enhancement mode transistor 22.

The overheating detection circuit 33 may include a pn junction which is thermally coupled to the switching circuit. The pn junction may be provided by a diode 111 integrated in low voltage enhancement mode transistor 22, for example. The pn junction may be forward biased or reversed biased and, in either case, has a predetermined temperature dependent voltage characteristic which can be used to detect the temperature of the pn junction.

If the detected temperature exceeds a predetermined threshold value, this may mean that the low voltage enhancement mode transistor 22 and/or the high-voltage depletion mode transistor 23 is overheated as the pn junction is thermally coupled with the low voltage enhancement mode transistor 22 and the high-voltage depletion mode transistor 23. In this case, the switching circuit 20 may be switched off.

As discussed above, the switching circuit with an overheating detection circuit may be formed by a high-voltage depletion mode transistor and a low voltage enhancement mode transistor having various arrangements.

FIG. 4 illustrates a switching circuit 50 according to an embodiment in which the high voltage depletion mode transistor 51 is provided in a first package 52 and the low voltage enhancement mode transistor 53 is provided in a second package 54 which is separate from the first package 52.

The low voltage enhancement mode transistor 53 is a vertical MOSFET device including a drain pad 55 on its lower surface and a source pad 63, a gate pad 64 and a sense pad 65 on its upper surface.

The high-voltage depletion mode transistor 51 is a gallium nitride-based HEMT and includes a source pad 56, a gate pad 67 and a drain pad 66 on its upper surface.

The drain pad 55 of the low voltage enhancement mode transistor 53 is electrically coupled to the source pad 56 of the high-voltage depletion mode transistor 51 in order to couple the current path 57 of the low voltage enhancement mode transistor 53 in series with the current path 58 of the high-voltage depletion mode transistor 51.

A conductive connector 59 may be used to couple an outer contact 60 of the second package 54, which is coupled to the drain pad 55 of the low voltage enhancement mode transistor 53, to an outer contact 61 of the second package 52, which is coupled to the source pad 56 of the high voltage depletion mode transistor 51. The conductive connector 59 is positioned outside of the two packages 52, 54. The conductive connector 59 may be provided by a conductive trace of a circuit board, for example. The switching circuit 50 further includes an overheating detection circuit 62 including which, in the embodiment illustrated in FIG. 4, is monolithically integrated in the low voltage enhancement mode transistor 53.

Forming the switching circuit 50 using a discrete package 54 for the low voltage enhancement mode transistor 53 and a separate, discrete package 52 for the high-voltage depletion mode transistor 51 may enable the use of standard components to be coupled together to form the switching circuit 50.

The gate pad 67 of the high-voltage depletion mode transistor is coupled to the source pad 63 of the low voltage enhancement mode transistor in a cascode configuration. The switching circuit 50 includes an input source node which is coupled to the source 63 of the low voltage enhancement mode transistor 53, an input drain node which is coupled to the drain pad 66 of the high-voltage depletion mode transistor, a gate node which is electrically coupled to the gate pad 64 of the low voltage enhancement mode transistor 53 and a sense node which is electrically coupled to the sense pad 65 of the overheating detection circuit 62.

FIG. 5 illustrates a switching circuit 70 according to an embodiment. The switching circuit 70 includes a low voltage enhancement mode transistor 71 in the form of a vertical MOSFET and a high-voltage depletion mode transistor 72 in the form of the gallium nitride-based HEMT which are arranged adjacent one another within a common package 73 to form a composite package.

The low voltage enhancement mode transistor 71 includes a source pad 74, a gate pad 75, a first temperature sense pad 76 and a second temperature sense pad 77 on its upper surface and a drain pad 78 on its lower surface. The high-voltage depletion mode transistor includes a source pad 79, a gate pad 80 and a drain pad 81 on its upper surface.

The drain pad 78 of the low voltage enhancement mode transistor 71 is electrically coupled to the source pad 79 of the high-voltage depletion mode transistor 72 and the gate pad 80 of the high-voltage depletion mode transistor 72 is electrically coupled to the source pad 74 of the low voltage enhancement mode transistor 71 in a cascode configuration.

The composite package 73 includes a source node which is electrically coupled to the source pad 74 of the low voltage enhancement mode transistor 71, a drain node which is electrically coupled to the drain pad 81 of the high-voltage depletion mode transistor 72, a gate node which is electrically coupled to the gate pad 75 of the low voltage enhancement mode transistor 71, a first temperature sense node electrically coupled to the first temperature sense pad 76 and a second temperature sense node which is electrically coupled to the second temperature sense pad 77.

The composite package 73, and therefore the switching circuit 70, further includes an overheating detection circuit 82 for detecting overheating of the switching circuit. The overheating detection circuit 82 is arranged at least partially in the low voltage enhancement mode transistor 71.

If the overheating detection circuit 82 detects that the temperature has exceeded a predetermined threshold, this may mean that the low voltage enhancement mode transistor 71 and/or the high voltage depletion mode transistor 72 may be about to suffer a fault or is faulting. This information may be used to switch off the switching circuit 80.

Since the low voltage enhancement mode transistor 71, the high voltage depletion mode transistor 72 and the overheating detection circuit 82 are arranged in a composite package, the composite package can be considered to include a normally off hybrid device including a temperature sense function and overheating protection.

FIG. 6 illustrates a switching circuit 90 according to an embodiment which includes a low voltage enhancement mode transistor 91 in the form of a silicon-based MOSFET device and a high-voltage depletion mode transistor 92 in the form of a gallium nitride-based HEMI and an overheating detection circuit 93.

In this embodiment, the low voltage enhancement mode transistor 91 and the high-voltage depletion mode transistor 92 are monolithically integrated to form a composite component 94.

The silicon-based low voltage enhancement mode transistor 91 may be used as a substrate for the subsequent deposition of the high-voltage depletion mode transistor 92. The electrical connection between the drain pad of the low voltage enhancement mode transistor 91 and the source of the high-voltage depletion mode transistor 92 required by the switching circuit 90 may be provided at the interface 95 between the low voltage enhancement transistor 91 and the high-voltage depletion mode transistor 92.

FIG. 7 illustrates a more detailed view of a switching circuit 100 which includes a low voltage enhancement mode transistor 101 which is monolithically integrated with a high-voltage depletion mode transistor 102 and which provides a switching circuit as, for example, illustrated in FIG. 2. The switching circuit 100 may be provided as a single package.

The low voltage enhancement mode transistor 101 is a silicon-based MOSFET device including a source pad 103, a gate pad 104 and a sense pad 105 on its lower surface and a drain electrode 106 formed by a highly doped region of the silicon body 107 on its upper surface. The low voltage enhancement mode transistor 101 includes a plurality of transistor cells 112 within the silicon body 107. The transistor cells 112 are connected in parallel with one another and integrated in the silicon body 107.

The switching circuit 100 includes an overheating detection circuit 109 which is a least partially integrated in the silicon body 107 of the low voltage enhancement mode transistor 101.

The sense circuit 109 further includes a temperature sense pad 105 coupled to the overheating detection circuit. In some embodiments, the overheating detection circuit 109 further includes a second sense pad on the silicon body 107.

The switching circuit 100 further includes logic 113 integrated in the semiconductor body 107 for detecting If the logic 113 detects that the temperature has exceeded a predetermined threshold, this may mean that the low voltage enhancement mode transistor 101 and/or the high voltage depletion mode transistor 102 may be about to suffer a fault or is faulting. This information may be used to switch off the switching circuit 100.

The switching circuit 100 further includes a high-voltage depletion mode transistor 102 which is monolithically integrated with the low voltage enhancement mode transistor 101. The high-voltage depletion mode transistor 102 is, in this embodiment, a gallium nitride-based HEMT which includes a gallium nitride layer 114 which is deposited on, and monolithically integrated with, the drain 106 of the low voltage enhancement mode transistor. The silicon body 107 may be considered to provide a semiconductor substrate for the HEMT deposited on top. The high voltage depletion mode transistor 102 further includes an aluminum gallium nitride layer 115 arranged on the gallium nitride layer 114 and a gallium nitride cap layer 116 arranged on the aluminum gallium nitride layer 115.

The high-voltage depletion mode transistor includes a source 117 which extends through the cap layer 116, the aluminum gallium nitride layer 115 and the gallium nitride layer 114 and is arranged on, and electrically coupled with, the drain 106 of the low voltage enhancement mode transistor 101. The high-voltage depletion mode transistor 102 further includes a drain electrode 118 which extends through the cap layer 116 and the aluminum gallium nitride layer 115 and is in contact with the gallium nitride layer 114. The high-voltage depletion mode transistor 102 further includes a gate electrode 119 which is arranged on the cap layer 116 and is laterally positioned between the source electrode 117 and the drain electrode 118. A two-dimensional gas is formed by spontaneous polarization at the interface 120 between the aluminum gallium nitride layer 115 and the gallium nitride layer 114. The gallium nitride layer 114 may be considered to be a channel layer and the aluminum gallium nitride layer 115 may be considered to be a barrier layer.

The switching circuit 100 further includes an electrical connection, for example in the form of a bond wire 128, between the gate electrode 119 of the high-voltage depletion mode transistor 102 and a conductive trace 121 on which the source pad 103 of the low voltage enhancement mode transistor 101 is mounted. Consequently, the gate electrode 119 of the high-voltage depletion mode transistor 102 is electrically coupled to the source 103 of the low voltage enhancement mode transistor 101 in a cascode configuration. The drain electrode 118 of the high voltage depletion mode transistor 102 is electrically coupled to a drain trace 122 by further electrical connection, for example a clip 123.

The low voltage enhancement mode transistor has a source down arrangement so that the source pad 103 is mounted on a trace 122 of the substrate 129, for example by solder, and the gate pad 104 and the temperature sense pad 105 are mounted on a further trace 124 arranged on the substrate 129, for example by solder.

The switching circuit 100 includes a drain node electrically coupled to the drain trace 121, a source node electrically coupled to the trace 120, a gate node electrically coupled to the trace 122 which is coupled to the gate pad 104. The sense pad 105 is coupled to the logic 113 by bond wire 123. The logic 113 is further coupled to two further traces 124, 125 by bond wires 126.

The substrate 129 may be a redistribution board or a lead frame.

The overheating detection circuit 109 of the switching circuit 100 includes a pn junction 110 which is integrated in the silicon body 107. The pn junction 110 may be provided by a diode 111 integrated in the silicon body 107, for example. The pn junction 110 may be forward biased or reversed biased and, in either case, has a predetermined temperature dependent voltage characteristic which can be used to detect the temperature of the pn junction 110.

As the pn junction 110 is integrated in the silicon body 107, the temperature of the pn junction 110 is substantially the same as the temperature of the low voltage enhancement mode transistor 101. Since the low voltage enhancement mode transistor 101 is thermally coupled with the high-voltage depletion mode transistor 102, the overheating detection circuit 109 is also thermally coupled to the high voltage enhancement mode transistor 102 and can provide overheating protection for both the low voltage enhancement mode transistor 101 and for the high-voltage depletion mode transistor 102 if one or both of the transistors overheats.

In an embodiment, the pn junction 110 is forward biased and has a voltage drop which is inversely proportional to the junction temperature. The overheating detection circuit 109 further includes voltage means coupled to the forward biased pn junction 110 for producing a voltage proportional to the voltage drop. The overheating detection circuit 109 also includes threshold means for receiving the voltage produced by the voltage means and for producing a signal when the voltage exceeds a threshold voltage to indicate that the temperature has exceeded a predetermined threshold value. If the temperature exceeds the predetermined threshold value, this may mean that the low voltage enhancement mode transistor 101 and/or the high-voltage depletion mode transistor are overheated. In this case, the logic 113 can determine that the switching circuit 100 should be switched off and switch off the switching circuit 100.

In an embodiment, the pn junction 110 of the overheating detection circuit 109 is reverse biased and has a reverse leakage current flow which is temperature dependent.

In this embodiment, the overheating detection circuit 109 may include voltage means coupled to the reverse biased pn junction 110 for producing a voltage proportional to the reverse leakage current flow. The overheating detection circuit 109 may also include threshold means for receiving the voltage from the voltage means and for producing a signal when voltage is exceeds a threshold voltage which indicates that the temperature has exceeded a predetermined threshold temperature. If the temperature exceeds the predetermined threshold value, this may mean that the low voltage enhancement mode transistor 101 and/or the high-voltage depletion mode transistor are overheated. In this case, the logic 113 can determine that the switching circuit 100 should be switched off.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A switching circuit, comprising:
   input drain, source and gate nodes;
   a depletion mode transistor comprising a current path coupled in series with a current path of an enhancement mode transistor, the depletion mode transistor having a higher blocking voltage capability than the enhancement mode transistor; and
   an overheating detection circuit for detecting overheating of the switching circuit,
   wherein the enhancement mode transistor is an IGFET,
   wherein the depletion mode transistor is a Group III-Nitride-based transistor,
   wherein the enhancement mode transistor comprises a plurality of transistor cells connected in parallel with each other and integrated in a semiconductor substrate and a biased pn junction integrated in the same semiconductor substrate having a predetermined temperature dependent voltage characteristic.

2. The switching circuit according to claim 1, wherein the IGFET is a p-channel MOSFET.

3. The switching circuit according to claim 1, wherein the overheating detection circuit is at least partially integrated in the enhancement mode transistor.

4. The switching circuit according to claim 1, wherein the enhancement mode transistor comprises a plurality of transistor cells connected in parallel with each other and integrated in a semiconductor substrate and a forward biased pn junction integrated in the same semiconductor substrate having a voltage drop which is inversely proportional to the junction temperature.

5. The switching circuit according to claim 4, further comprising voltage means coupled to said forward biased pn junction for producing a voltage proportional to said voltage drop.

6. The switching circuit according to claim 5, wherein the overheating detection circuit comprises threshold means for receiving the voltage and producing a signal when the voltage exceeds a threshold voltage to indicate that said enhancement mode transistor is overheated.

7. The switching circuit according to claim 1, wherein the enhancement mode transistor comprises a plurality of transistor cells connected in parallel with each other and integrated in a semiconductor substrate and a reverse biased pn junction integrated in the same semiconductor substrate having a reverse leakage current flow which is temperature dependent.

8. The switching circuit according to claim 7, further comprising voltage means coupled to said reverse biased pn junction for producing a voltage proportional to said reverse leakage current flow.

9. The switching circuit according to claim 8, wherein the overheating detection circuit comprises threshold means for receiving the voltage and producing a signal when the voltage exceeds a threshold voltage to indicate that said enhancement mode transistor is overheated.

10. The switching circuit according to claim 1, wherein the overheating detection circuit further comprises a first overheating detection pad and a second overheating detection pad on said semiconductor substrate and coupled to said biased pn junction.

11. The switching circuit according to claim 1, further comprising at least one overheating detection node.

12. The switching circuit according to claim 1, wherein the depletion mode transistor is operatively connected in a cascode arrangement to said enhancement mode transistor.

13. The switching circuit according to claim 1, wherein the depletion mode transistor is directly driven.

14. The switching circuit according to claim 1, wherein the depletion mode transistor is provided as a discrete component and the enhancement mode transistor is provided as a discrete component.

15. The switching circuit according to claim 1, wherein the depletion mode transistor and the enhancement mode transistor are mounted adjacent one another in a composite package.

16. The switching circuit according to claim 1, wherein the depletion mode transistor and the enhancement mode transistor are monolithically integrated.

17. The switching circuit according to claim 16, further comprising logic for detecting if the temperature has exceeded a predetermined threshold, the logic being integrated in a semiconductor body of the enhancement mode transistor.

18. The switching circuit according to claim 17, wherein the logic is configured to switch off the switching circuit if the detected temperature exceeds a predetermined threshold value.

19. The switching circuit according to claim 16, wherein the enhancement mode transistor is silicon-based and an electrical connection between a drain of the enhancement mode transistor and a source of the depletion mode transistor is provided at an interface between the enhancement mode transistor and the depletion mode transistor.

20. The switching circuit according to claim 1, wherein the depletion mode transistor is a Group III-Nitride-based high electron mobility transistor (HEMT).

* * * * *